(12) United States Patent
Hou et al.

(10) Patent No.: US 11,937,388 B2
(45) Date of Patent: Mar. 19, 2024

(54) SCREEN BODY SUPPORT DEVICE AND FOLDABLE FLEXIBLE DISPLAY DEVICE

(71) Applicant: Yungu (Gu'an) Technology Co., Ltd., Langfang (CN)

(72) Inventors: Hongqi Hou, Langfang (CN); Fu Liao, Langfang (CN); Yuhua Wu, Langfang (CN); Liwei Ding, Langfang (CN); Zhaoji Zhu, Langfang (CN); Liuyang Wang, Langfang (CN)

(73) Assignee: Yungu (Gu'an) Technology Co., Ltd.wq, Langfang (CN)

( * ) Notice: Subject to any disclaimer, the term of this patent is extended or adjusted under 35 U.S.C. 154(b) by 427 days.

(21) Appl. No.: 17/236,157

(22) Filed: Apr. 21, 2021

(65) Prior Publication Data

US 2021/0251093 A1 Aug. 12, 2021

Related U.S. Application Data

(63) Continuation of application No. PCT/CN2019/106424, filed on Sep. 18, 2019.

(30) Foreign Application Priority Data

Mar. 21, 2019 (CN) .......................... 201920367316.2

(51) Int. Cl.
*H05K 5/00* (2006.01)
*F16H 37/12* (2006.01)
(Continued)

(52) U.S. Cl.
CPC ......... *H05K 5/0217* (2013.01); *F16H 37/122* (2013.01); *F16M 11/10* (2013.01); *F16M 11/18* (2013.01); *H05K 5/0017* (2013.01)

(58) Field of Classification Search
CPC .. H05K 5/0217; H05K 5/0017; F16H 37/122; F16M 11/10; F16M 11/18
(Continued)

(56) References Cited

U.S. PATENT DOCUMENTS

| 8,971,031 B2* | 3/2015 | Mok ....................... G09F 9/301 |
| | | 361/679.27 |
| 2013/0021762 A1* | 1/2013 | van Dijk ............... H04M 1/022 |
| | | 361/749 |
| 2015/0296641 A1 | 10/2015 | Song et al. |

FOREIGN PATENT DOCUMENTS

| CN | 206112430 U | 4/2017 |
| CN | 206195847 U | 5/2017 |

(Continued)

OTHER PUBLICATIONS

PCT International Search Report for International Application No. PCT/CN2019/106424 dated Dec. 20, 2019.
(Continued)

*Primary Examiner* — Binh B Tran
(74) *Attorney, Agent, or Firm* — Rimon PC

(57) ABSTRACT

Embodiments of the present application provide a screen body support device, including: a fixing bracket; a movable bracket being rotatably connected with the fixing bracket, in which the movable bracket and the fixing bracket are provided in a non-display area of a flexible display screen; and a driving component being fixedly connected with the movable bracket, in which the driving component is configured to drive the movable bracket to swing in two opposite directions with respect to the fixing bracket, so that the flexible display screen is bent in two opposite directions respectively.

10 Claims, 5 Drawing Sheets

(51) Int. Cl.
    *F16M 11/10*     (2006.01)
    *F16M 11/18*     (2006.01)
    *H05K 5/02*     (2006.01)

(58) Field of Classification Search
    USPC .......................................................... 361/807
    See application file for complete search history.

(56) References Cited

FOREIGN PATENT DOCUMENTS

| CN | 107229372 A | 10/2017 |
|----|-------------|---------|
| CN | 107860561 A | 3/2018  |
| CN | 108682302 A | 10/2018 |
| CN | 109091876 A | 12/2018 |
| CN | 109268652 A | 1/2019  |
| CN | 109298748 A | 2/2019  |

OTHER PUBLICATIONS

PCT Written opinion for International Application No. PCT/CN2019/106424 dated Dec. 20, 2019.

\* cited by examiner

SCREEN BODY SUPPORT DEVICE AND FOLDABLE FLEXIBLE DISPLAY DEVICE

CROSS-REFERENCE TO RELATED APPLICATIONS

This application is a continuation of International Application No. PCT/CN2019/106424 filed on Sep. 18, 2019, which claims priority to Chinese patent application No. 201920367316.2 filed on Mar. 21, 2019. Both applications are incorporated herein by reference in their entireties.

TECHNICAL FIELD

The present application relates to the field of display technologies, and particularly to a screen body support device and a foldable flexible display device.

BACKGROUND

At present, flexible display screens have foldable advantages, which are widely used in military industry, medicine, exhibitions and other fields. However, a flexible display screen in a foldable flexible display device may be bend inward or outward, but not both.

SUMMARY

In view of this, embodiments of the present application provide a screen body support device and a foldable flexible display device, which solves a technical problem that a flexible display screen in a foldable flexible display device may not be bent inward and outward in the prior art.

According to one aspect of the present application, an embodiment of the present application provides a screen body support device, including: a fixing bracket; a movable bracket being rotatably connected with the fixing bracket, in which the movable bracket and the fixing bracket are provided in a non-display area of a flexible display screen; and a driving component being fixedly connected with the movable bracket, in which the driving component is configured to drive the movable bracket to swing in two opposite directions with respect to the fixing bracket, so that the flexible display screen is bent in two opposite directions respectively.

In an embodiment of the present application, the driving component includes: a power mechanism, and a swing driving mechanism. One end of the swing driving mechanism is rotatably connected with the power mechanism, and another end of the swing driving mechanism is fixedly connected with the movable bracket. The power mechanism drives the swing driving mechanism to move, so that the swing driving mechanism drives the movable bracket to swing in two opposite directions with respect to the fixing bracket.

In an embodiment of the present application, the swing driving mechanism includes: a driving mechanism and a transmission mechanism. One end of the driving mechanism is rotatably connected with the power mechanism. One end of the transmission mechanism is rotatably connected with another end of the driving mechanism, and another end of the transmission mechanism is fixedly connected with the movable bracket. The transmission mechanism, under an action of the driving mechanism, makes the movable bracket swing in two opposite directions with respect to the fixing bracket.

In an embodiment of the present application, the driving mechanism includes a crank-rocker mechanism. One end of the crank-rocker mechanism is rotatably connected with the power mechanism, and another end of the crank-rocker mechanism is rotatably connected with the transmission mechanism.

In an embodiment of the present application, the transmission mechanism includes a gear component. One end of the gear component is rotatably connected with another end of the driving mechanism, and another end of the gear component is fixedly connected with the movable bracket.

In an embodiment of the present application, the crank-rocker mechanism includes: a crank, in which one end of the crank is rotatably connected with the power mechanism; a linkage, in which one end of the linkage is rotatably connected with another end of the crank; and a rocker, in which one end of the rocker is rotatably connected with another end of the linkage. The gear component includes: a first gear, in which the first gear is fixedly connected to the movable bracket; and a second gear, in which the second gear meshes with the first gear, and the second gear is rotatably connected with another end of the rocker.

In an embodiment of the present application, the maximum angle value between the fixing bracket and the movable bracket changes with a transmission ratio of the first gear and the second gear.

In an embodiment of the present application, the power mechanism includes a drive motor, the drive motor is rotatably connected to one end of the swing driving mechanism, and the drive motor is configured to provide power for the swing driving mechanism, so that the swing driving mechanism, under an action of the power mechanism, drives the movable bracket to swing in two opposite directions with respect to the fixing bracket.

In an embodiment of the present application, the power mechanism further includes a motor fixing frame being fixedly connected with the drive motor and a base. The motor fixing frame is provided in the base.

According to another aspect of the present application, an embodiment of the present application provides a foldable flexible display device, including: a flexible display screen for display and a screen body support device according to any one of the embodiments provided above.

Embodiments of the present application provide a screen body support device and a foldable flexible display device. By dividing a bracket supporting the flexible display screen into a movable bracket and a fixing bracket, the movable bracket may swing in two opposite directions with respect to the fixing bracket under a drive action of a driving component, so that a part of the flexible display screen supported by the movable bracket may swing in two opposite directions with respect to a part of the flexible display screen supported by the fixing bracket. That is, the flexible display screen may be bend inward and outward, thereby realizing the inner and outer bending of the flexible display screen in the foldable flexible display device.

DETAILED DESCRIPTION OF THE EMBODIMENTS

As mentioned in the background technology, a flexible display screen in a foldable flexible display device may not be bent inward and outward. The inventor found through research that a reason for this problem is that when a flexible display screen is provided outside of a mobile terminal, a terminal mechanism needs to be shortened during bending to keep the screen from being stretched, and when the flexible display screen is provided inside the mobile terminal, the terminal mechanism needs to be longer during bending to keep the screen from being squeezed. Therefore, the mobile terminal can not realize the bidirectional bending inward and outward of the flexible display screen.

Based on this, the present application provides a screen body support device, which is applied to a foldable flexible display device. By dividing a bracket supporting the flexible display screen into a movable bracket and a fixing bracket, the movable bracket may swing in two opposite directions with respect to the fixing bracket under a drive action of a driving component, so that a part of the flexible display screen supported by the movable bracket may swing in two opposite directions with respect to a part of the flexible display screen supported by the fixing bracket. That is, the flexible display screen may be bend inward and outward, thereby realizing the inner and outer bending of the flexible display screen in the foldable flexible display device.

Specifically, the present application provides a screen body support device, including: a fixing bracket; a movable bracket being rotatably connected with the fixing bracket, in which the movable bracket and the fixing bracket are provided in a non-display area of a flexible display screen; and a driving component being fixedly connected with the movable bracket, in which the driving component is configured to drive the movable bracket to swing in two opposite directions with respect to the fixing bracket, so that the flexible display screen is bent in two opposite directions respectively.

The technical solution of the present application will be described clearly and completely below in combination with the accompanying drawings. Obviously, the described embodiments are only a part of the embodiments of the present application, not all of the embodiments. Based on the embodiments in the present application, all other embodiments obtained by a person skilled in the art without creative efforts shall fall within the protection scope of the present application.

Figure 1:
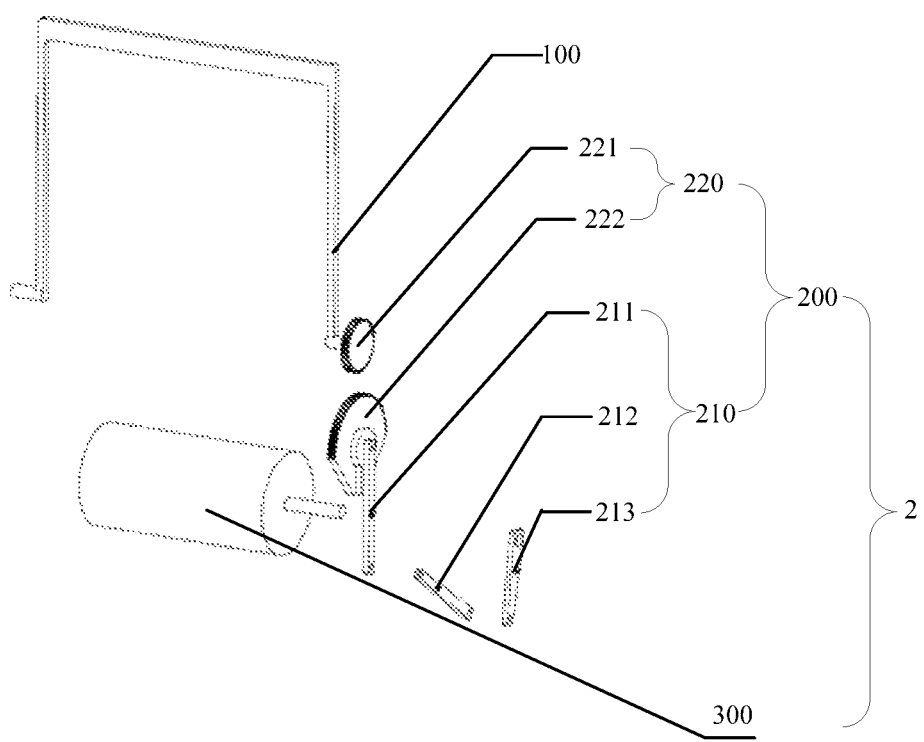
FIG. 1 is a structural schematic diagram of a screen body support device according to an embodiment of the present application.

FIG. 1 is a structural schematic diagram of a screen body support device according to an embodiment of the present application. As shown in FIG. 1, a screen body support device includes a fixing bracket (not shown in the figure), a movable bracket 100 and a driving component 2. The fixing bracket is rotatably connected with the movable bracket 100. The fixing bracket and the movable bracket 100 are provided in a non-display area of a flexible display screen for supporting the flexible display screen. The driving component 2 is configured to drive the movable bracket 100 to swing in two opposite directions with respect to the fixing bracket, so that a part of the flexible display screen supported by the movable bracket 100 may swing in two opposite directions with respect to a part of the flexible display screen supported by the fixing bracket. That is, the flexible display screen may be bend inward and outward, thereby realizing the inner and outer bending of the flexible display screen.

In an embodiment of the present application, as shown in FIG. 1, the driving component 2 includes: a power mechanism 300, and a swing driving mechanism 200. One end of the swing driving mechanism 200 is rotatably connected with the power mechanism 300, and another end of the swing driving mechanism 200 is fixedly connected with the movable bracket 100. The power mechanism 300 transmits power to the swing driving mechanism 200, and the swing driving mechanism 200 transmits the power to the movable bracket 100, so that the movable bracket 100 may rotate with respect to the fixing bracket, and a direction in which the power is applied to the movable bracket 100 may be changed. Thereby the movable bracket 100 may swing in opposite directions with respect to the fixing bracket, so that the flexible display screen may be bent in two opposite directions. That is, it may be realized bending outward and bending inward. The screen body support device provided by the embodiment of the present application can realize that the movable bracket swings in two opposite directions with respect to the fixing bracket through the relative rotation of the power mechanism and the swing driving mechanism, and the structure is simple.

Figure 2:
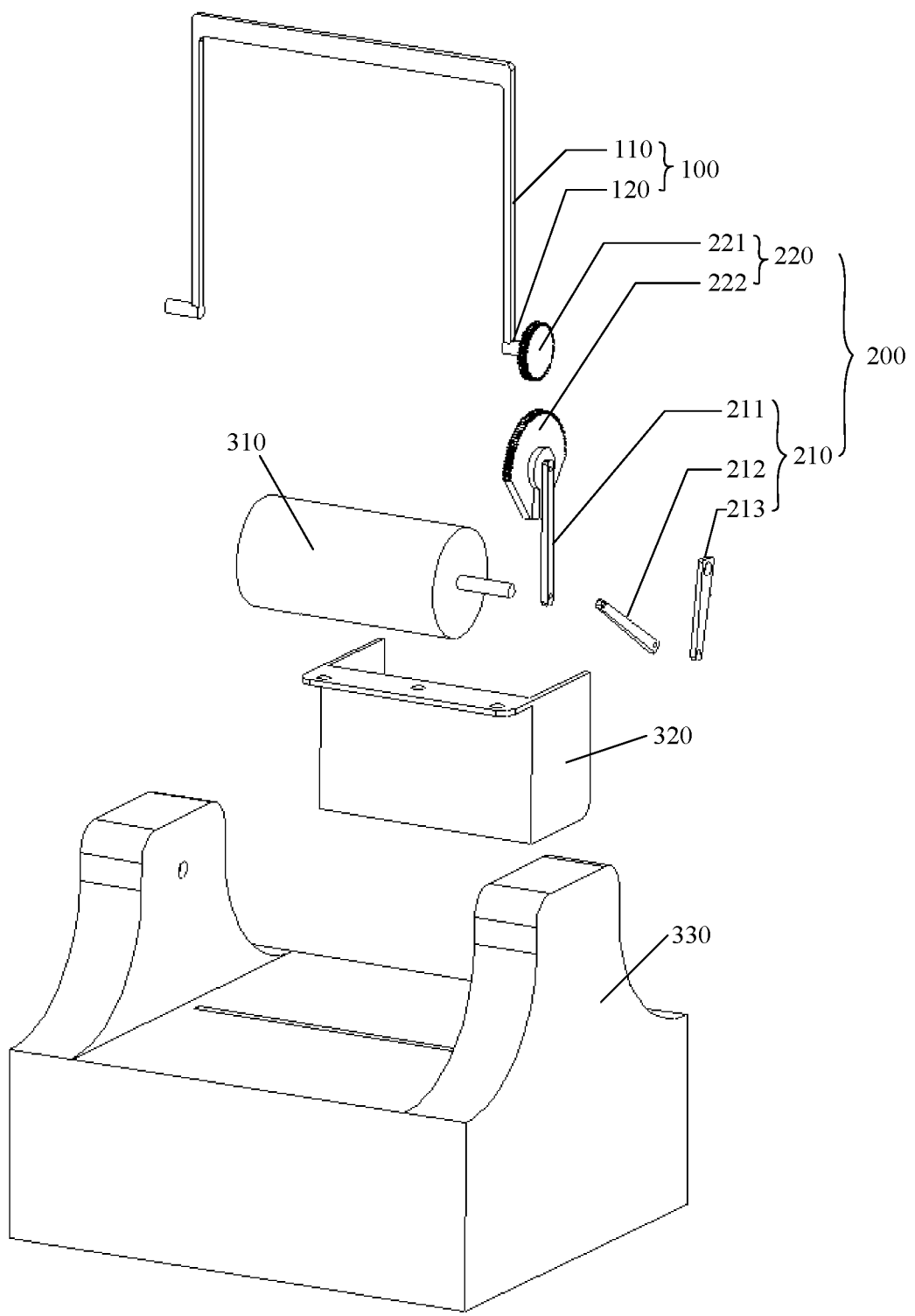
FIG. 2 is a structural schematic diagram of a screen body support device according to another embodiment of the present application.

In an embodiment of the present application, the power mechanism 300 is a drive motor. As shown in FIG. 2, the drive motor 310 is rotatably connected to one end of the swing driving mechanism 200. The drive motor 310 is configured to provide power for the swing driving mechanism 200, so that the swing driving mechanism 200, under an action of the power mechanism 300, drives the movable bracket 100 to swing in two opposite directions with respect to the fixing bracket.

In an embodiment of the present application, as shown in FIG. 1, the swing driving mechanism 200 includes a driving mechanism 210 and a transmission mechanism 220. One end of the driving mechanism 210 is rotatably connected with the power mechanism 300, another end of the driving mechanism 210 is rotatably connected with one end of the transmission mechanism 220, and another end of the transmission mechanism 220 is fixedly connected with the movable bracket 100. When a flexible screen is bent, the power mechanism 300 transmits power to the driving mechanism 210, the driving mechanism 210 transmits the power to the transmission mechanism 220, and the transmission mechanism 220 transmits the power to the movable bracket 100, thereby driving the movable bracket 100 with respect to the fixing bracket swing in a direction of the power applied to the movable bracket 100. In a process of power transmission, the driving mechanism 210 may change the direction of the power, so that the movable bracket 100 may swing in two opposite directions respectively, so that the flexible display screen may be bended inward or outward. The screen body support device according to the embodiment of the present application converts the power obtained from the power mechanism into a power in two opposite directions by adopting the driving mechanism, thereby reducing a complexity of the device.

In an embodiment of the present application, the driving mechanism 210 is a crank-rocker mechanism, and the transmission mechanism 220 is a gear component. The crank-rocker mechanism may generate two forces in opposite directions, the gear component may convert the two forces in opposite directions into two forces applied on the movable bracket 100, and the directions of the two forces applied to the movable bracket 100 are opposite, so that the movable bracket 100 may swing in two opposite directions with respect to the fixing bracket, so that the flexible display screen may be bent inward and outward. The screen body support device according to the embodiment of the present application may realize an inner and outer bending of the flexible display screen through a cooperation of the crank-rocker mechanism and the gear component, and has a simple structure and easy realization in technology.

In an embodiment of the present application, as shown in FIG. 2, the crank-rocker mechanism includes a crank 213, a linkage 212, and a rocker 211, and the power mechanism 300 includes a drive motor 310. The gear component includes a first gear 221 and a second gear 222. The movable bracket 100 includes a swing bracket 110 and a crossbar 120. One end of the crank 213 is rotatably connected with the drive motor 310, another end of the crank 213 is rotatably connected with one end of the linkage 212, another end of the crank 213 is rotationally connected with one end of the rocker 211, another end of the rocker 211 is rotationally connected with the second gear 222, the second gear 222 meshes with the first gear 221, the first gear 221 is rotatably connected with the crossbar 120, and the crossbar 120 is fixedly connected with the swing bracket 110. The drive motor 310 rotates to drive the crank 213 to rotate, the crank 213 rotates to drive the linkage 212 to move, and the moving of the linkage 212 drives the rocker 211 to rotate. The following describes in detail a process of the screen body support device to realize the inward bending, unbending and outward bending of the flexible display screen.

Figure 3:
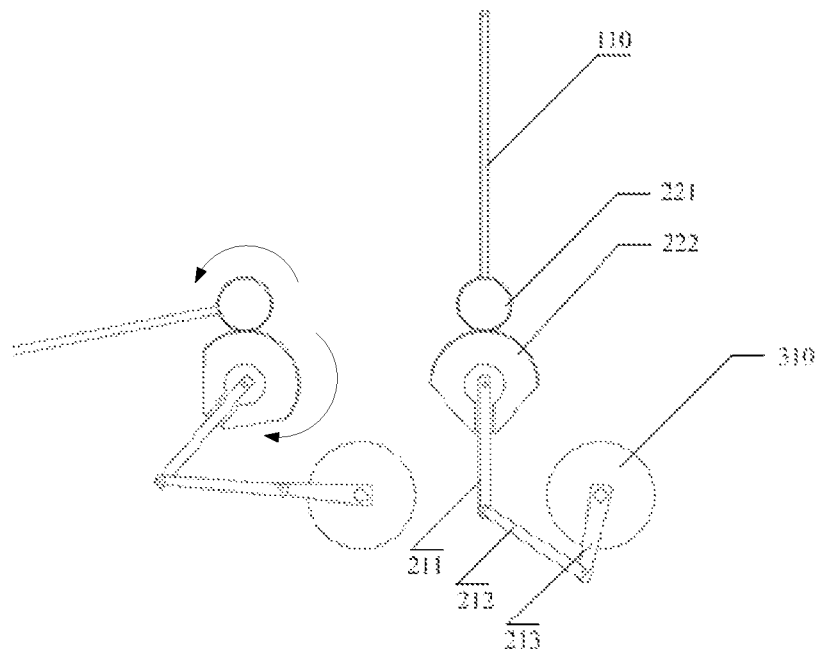
FIG. 3 is a schematic diagram of folding a flexible display screen by the screen body support device shown in FIG. 2 according to an embodiment of the present application.

When the drive motor 310 rotates clockwise, the rocker 211 rotates counterclockwise under an action of the crank 213 and the linkage 212, so that the second gear 222 rotates clockwise. The clockwise rotation of the second gear 222 drives the first gear 221 to rotate counterclockwise, thereby driving the crossbar 120 to rotate counterclockwise. As shown in FIG. 3, the counterclockwise rotation of the crossbar 120 drives the swing bracket 110 to rotate counterclockwise, so that a part of the flexible display screen supported by the swing bracket 110 rotates counterclockwise with respect to the fixing bracket, so as to realize a folding of the flexible display screen. When a non-display surface of the flexible display screen is provided on a right side of the swing bracket 110, the swing bracket 110 rotates counterclockwise, and the part of the flexible display screen supported by the swing bracket 110 may be folded inward with respect to the fixing bracket.

Figure 4:
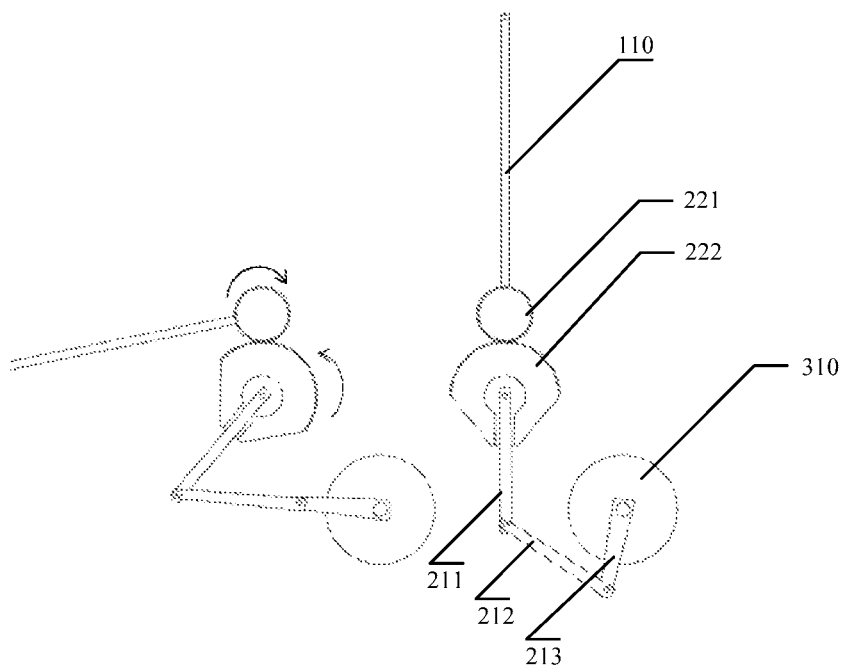
FIG. 4 is a schematic diagram of expanding a flexible display screen by the screen body support device shown in FIG. 2 according to an embodiment of the present application.
Figure 5:
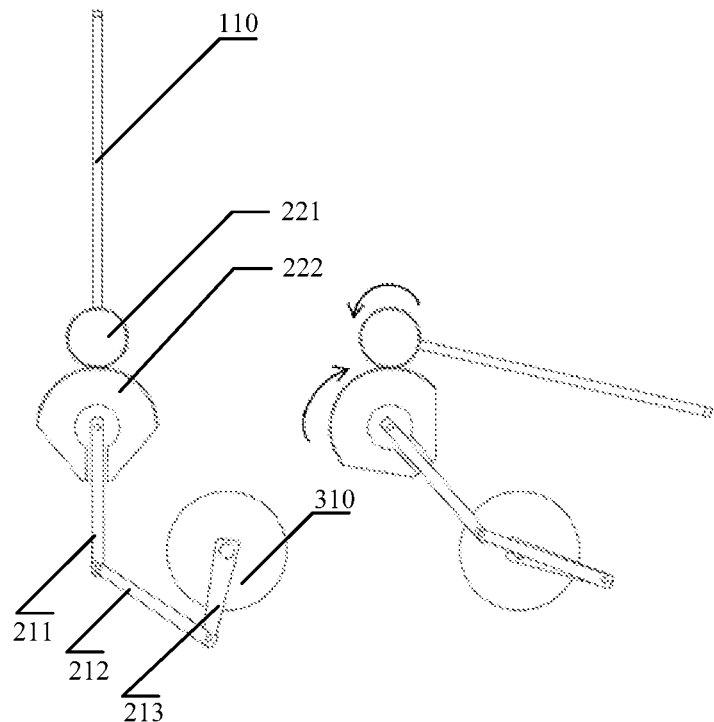
FIG. 5 is a schematic diagram of expanding a flexible display screen by the screen body support device shown in FIG. 2 according to another embodiment of the present application.

The above describes how the flexible display screen may be folded inward, when the non-display surface of the flexible display screen is provided on a right side of the swing bracket 110. As shown in FIG. 4, when the non-display surface of the flexible display screen is provided on the right side of the swing bracket 110 and is in the folded state and the flexible display screen screen needs to be unfolded from a bent state to a unfolded state, it is only necessary to rotate the drive motor 310 counterclockwise and the rocker 211 rotates counterclockwise under an action of the crank 213 and the linkage 212, so that the second gear 222 rotates counterclockwise, and the counterclockwise rotation of the second gear 222 drives the first gear 221 to rotate clockwise, thereby driving the crossbar 120 to rotate clockwise. The clockwise rotation of the crossbar 120 drives the swing bracket 110 to rotate clockwise, so that the part of the flexible display screen supported by the swing bracket 110 rotates clockwise with respect to the fixing bracket, and then the flexible display screen is unfolded. Similarly, as shown in FIG. 5, when the drive motor 310 rotates counterclockwise, the rocker 211 rotates counterclockwise under an action of the crank 213 and the linkage 212, so that the second gear 222 rotates counterclockwise, and the counterclockwise rotation of the second gear 222 drives the first gear 221 to rotate clockwise, thereby driving the crossbar 120 to rotate clockwise. The clockwise rotation of the crossbar 120 drives the swing bracket 110 to rotate clockwise, so that the part of the flexible display screen supported by the swing bracket 110 rotates clockwise with respect to the fixing bracket, and then the flexible display screen is unfolded. When the non-display surface of the flexible display screen is provided on the right side of the swing bracket 110, the swing bracket 110 rotates clockwise, and the part of the flexible display screen supported by the swing bracket 110 may be folded outward with respect to the fixing bracket. On the contrary, when the non-display surface of the flexible display screen is provided on the left side of the swing bracket 110, the swing bracket 110 rotates clockwise, and the part of the flexible display screen supported by the swing bracket 110 may be folded inward with respect to the fixing bracket.

Figure 6:
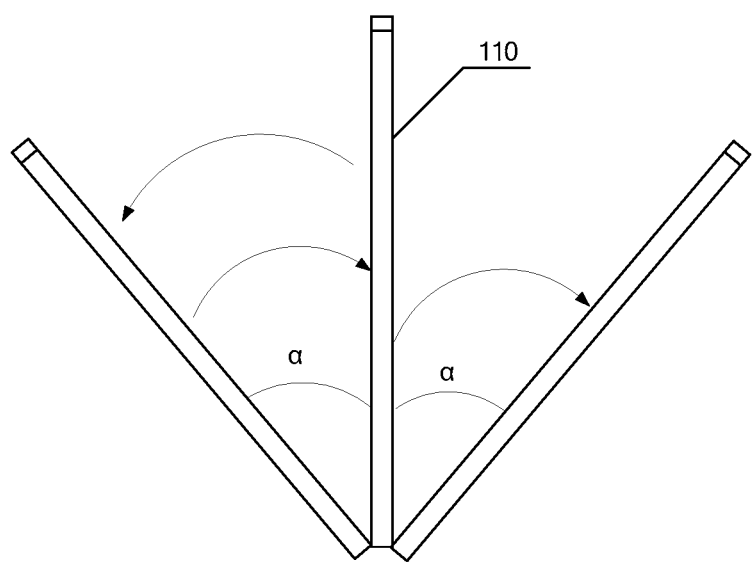
FIG. 6 is a structural schematic diagram of a movable bracket in a screen body support device swings to a limit position according to another embodiment of the present application.

In a further embodiment of the present application, whether the flexible display screen is folded inward or outward, that is, when the swing bracket 110 in the movable bracket 100 rotates counterclockwise or clockwise with respect to the fixing bracket, as shown in FIG. 6, when the swing bracket 110 swings to the extreme position with respect to the fixing bracket, an angle α between the swing bracket 110 and the fixing bracket changes with the transmission ratio of the first gear 221 and the second gear 222. That is, the maximum bending angle of the flexible display screen is related to the transmission ratio of the first gear 221 and the second gear 222. The greater the transmission ratio of the first gear 221 and the second gear 222, the greater the maximum bending angle of the flexible display screen. The screen body support device according to the embodiment of the present application may change the maximum bending angle of the flexible display screen inward or outward by changing the transmission ratio of the first gear 221 and the second gear 222 according to the actual needs of users, and the gears may be easily installed and disassembled.

Figure 7:
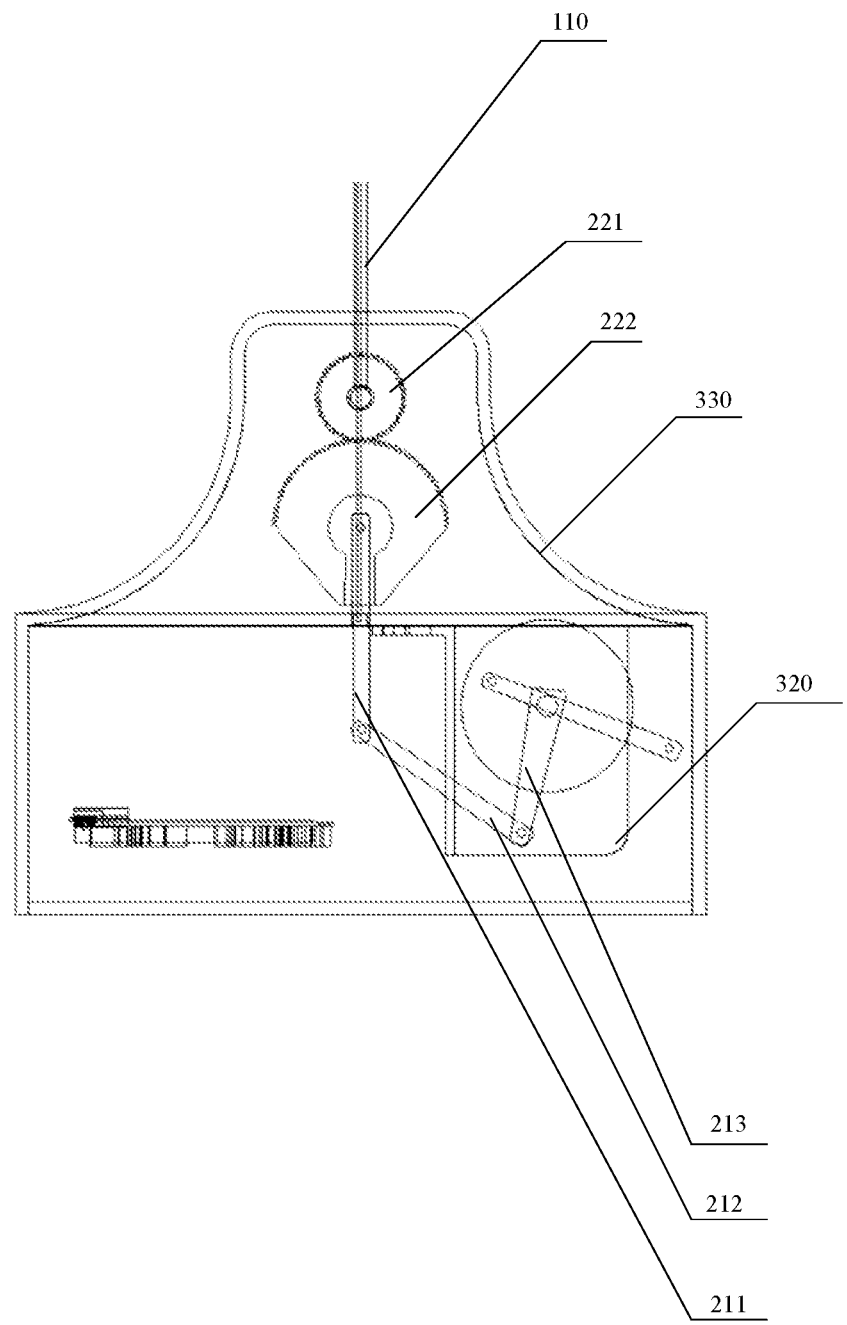
FIG. 7 is a schematic diagram of a assembly of a motor fixing frame, a base and a driving component in a screen body support device according to an embodiment of the present application.

In an embodiment of the present application, the power mechanism 300 also includes a motor fixing frame 320 and a base 330. As shown in FIG. 2, the motor fixing frame 320 is used to fix the drive motor 310. As shown in FIG. 7, the motor fixing frame 320 is provided in the base 330, which may not only fix the motor to make the motor work stably, but also may conveniently replace or repair the drive motor as needed.

An embodiment of the present application also provides a foldable flexible display device, including: a flexible display screen for display and a screen body support device provided by any of the above embodiments. A structure of the screen body support device comprises a structure of the screen body support device described above. The foldable flexible display device provided by the embodiments of the present application may swing in two different directions through the screen body support device, so that the foldable flexible display device may be folded inward and outward.

The above embodiments only the preferred embodiments of the present application, and are not intended to limit the present application. Any modification, equivalent replacement, etc. made within the spirit and principles of the present application should be included in the scope of protection of the present application.

What is claimed is:

1. A screen body support device, comprising:
   a fixing bracket;
   a movable bracket rotatably connected with the fixing bracket, the movable bracket and the fixing bracket being provided in a non-display area of a flexible display screen; and
   a driving component fixedly connected with the movable bracket, the driving component being configured to drive the movable bracket to swing in two opposite directions with respect to the fixing bracket, and to bend the flexible display screen in the two opposite directions, respectively,
   wherein the driving component comprises:
   a power mechanism, and
   a swing driving mechanism, wherein one end of the swing driving mechanism is rotatably connected with the power mechanism, and another end of the swing driving mechanism is fixedly connected to the movable bracket;
   wherein the power mechanism is configured to drive the swing driving mechanism to drive the movable bracket to swing in the two opposite directions with respect to the fixing bracket.

2. The screen body support device according to claim 1, wherein the swing driving mechanism comprises:
   a driving mechanism, wherein one end of the driving mechanism is rotatably connected with the power mechanism; and
   a transmission mechanism, wherein one end of the transmission mechanism is rotatably connected with another end of the driving mechanism, and another end of the transmission mechanism is fixedly connected to the movable bracket;
   wherein the driving mechanism drives the transmission mechanism to make the movable bracket swing in the two opposite directions with respect to the fixing bracket.

3. The screen body support device according to claim 2, wherein the driving mechanism comprises:
   a crank-rocker mechanism, wherein one end of the crank-rocker mechanism is rotatably connected to the power mechanism, and another end of the crank-rocker mechanism is rotatably connected to the transmission mechanism.

4. The screen body support device according to claim 2, wherein the transmission mechanism comprises:
   a gear component, wherein one end of the gear component is rotatably connected with another end of the driving mechanism, and another end of the gear component is fixedly connected to the movable bracket.

5. The screen body support device according to claim 4, wherein the driving mechanism comprises a crank-rocker mechanism comprising:
   a crank, one end of the crank being rotatably connected with the power mechanism;
   a linkage, one end of the linkage being rotatably connected with another end of the crank; and
   a rocker, one end of the rocker being rotatably connected with another end of the linkage;
   wherein the gear component comprises:
   a first gear, wherein the first gear is connected to the movable bracket; and
   a second gear, wherein the second gear meshes with the first gear, and the second gear is rotatably connected to another end of the rocker.

6. The screen body support device according to claim 5, wherein a maximum angle between the fixing bracket and the movable bracket changes with a transmission ratio of the first gear to the second gear.

7. The screen body support device according to claim 1, wherein the power mechanism comprises a drive motor, the drive motor is rotatably connected to one end of the swing driving mechanism, and the drive motor is configured to provide power for the swing driving mechanism, wherein the swing driving mechanism, powered by the power mechanism, drives the movable bracket to swing in the two opposite directions with respect to the fixing bracket.

8. The screen body support device according to claim 7, wherein the power mechanism further comprises:
   a motor fixing frame fixedly connected to the drive motor; and
   a base;
   wherein the motor fixing frame is provided in the base.

9. A foldable flexible display device, comprising:
   a flexible display screen for display; and
   a screen body support device according to claim 1.

10. A screen body support device, comprising:
    a fixing bracket;
    a movable bracket rotatably connected with the fixing bracket, the movable bracket and the fixing bracket being provided in a non-display area of a flexible display screen; and
    a driving component fixedly connected with the movable bracket, the driving component being configured to drive the movable bracket to swing in two opposite directions with respect to the fixing bracket, and to bend the flexible display screen in the two opposite directions respectively,
    wherein when a part of the flexible display screen supported by the movable bracket swings in a first direction, of the two opposite directions, with respect to a part of the flexible display screen supported by the fixing bracket, the flexible display screen bends in the first direction to realize inward bending of the flexible display screen from an unfolded state to a first bent state; and when the part of the flexible display screen supported by the movable bracket swings in a second direction, of the two opposite directions, with respect to the part of the flexible display screen supported by the fixing bracket, the flexible display screen bends in the second direction to realize outward bending of the flexible display screen from the unfolded state to a second bent state.

* * * * *